United States Patent [19]

Rankin

[11] 4,245,166

[45] Jan. 13, 1981

[54] THYRISTOR CONTROL CIRCUIT

[76] Inventor: John C. Rankin, 908 S. Hobart Blvd., Los Angeles, Calif. 90006

[21] Appl. No.: 18,248

[22] Filed: Mar. 6, 1979

[51] Int. Cl.³ .................. H03K 17/72; H03K 17/22; H03K 17/292
[52] U.S. Cl. ..................... 307/252 N; 307/252 B; 307/252 W; 323/326; 361/197
[58] Field of Search ........... 307/252 B, 252 T, 252 J, 307/252 N, 252 W, 252 VA, 293; 323/225 C; 361/196, 197, 198

[56] References Cited

U.S. PATENT DOCUMENTS 3,183,372 5/1965 Chin .............................. 307/252 N
3,316,477 4/1967 Shrider et al. ................. 323/225 C Primary Examiner—John Zazworsky

[57] ABSTRACT

A field effect transistor is used to short circuit the timing capacitor of a thyristor when power is interrupted or removed. The short circuiting of the timing capacitor prevents the residual capacitor charge from being added to a new charge after an interruption so that the early firing of the thyristor is avoided and component damage is prevented. Because capacitor charging always starts at zero voltage when the field effect transistor is used, hysteresis at low voltages is greatly improved.

1 Claim, 4 Drawing Figures

4,245,166

THYRISTOR CONTROL CIRCUIT

BACKGROUND OF THE INVENTION

This invention relates to the prevention of damage caused by the misfiring of a thyristor when the power supply is interrupted for a short period of time. This situation may occur for many reasons such as a momentary short circuit on the power line, the starting of a large motor with a locked rotor or the action of removing the line plug of the thyristor equipment from a socket where the circuit may be opened and closed during a period of some milliseconds before the final opening. In these instances, because the thyristor timing capacitor cannot immediately discharge through the resistor connected in series, the capacitor will retain most of the charge during the line voltage off period. When power is returned to the equipment, the time normally taken for the capacitor to reach the retained charge is subtracted from the required time and the thyristor fires too early. This type of misfiring is particularly troublesome with low voltage, line operated power supplies and in many instances component destruction is blamed on transient spikes on the power line instead of momentary dips.

SUMMARY OF THE INVENTION

A primary object of the invention is to provide a means of preventing destruction of equipment when the power supply connected to the timing circuit of a thyristor is interrupted. This is done by connecting a field effect transistor across the thyristor timing capacitor to discharge the capacitor in microseconds after the start of the interruption. When the interruption has ended, the capacitor has no charge and has to begin charging from zero volts until the required triggering point is reached and damage is avoided.

A further object of the invention is to provide a timing circuit with less hysteresis and greater range of control with few components. Because the timing capacitor is discharged at the end of each half cycle or zero crossing of the line voltage, the capacitor starts charging at zero voltage which takes a maximum time period to reach the triggering point, this results in the thyristor firing at a later point of the half cycle of the line voltage with lower output voltages available and a minimum of hysteresis.

DESCRIPTION OF THE PREFERRED EMBODIMENTS

Figure 1:
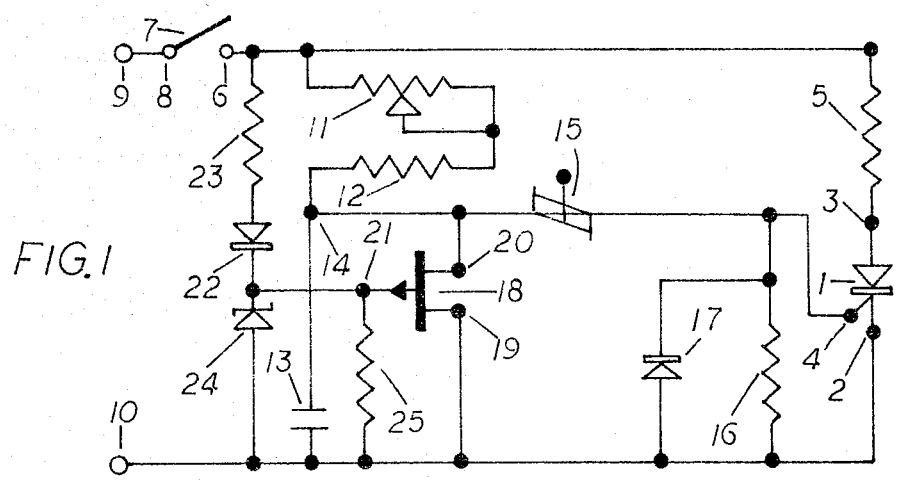
FIG. 1 is a schematic showing the fundamentals of the invention with a silicon controlled rectifier circuit having a P type field effect transistor connected across the timing capacitor.

Referring more particularly to FIG. 1 which shows a silicon controlled rectifier 1 having a cathode 2 an anode 3 and a gate 4. The anode 3 is connected through a load resistor 5 to contact 6 of switch 7 with contact 8 of switch 7 connected to alternating current supply terminal 9. Cathode 2 is shown connected to alternating current supply terminal 10. With switch 7 closed voltage is applied through variable resistor 11 and limiting resistor 12 to charge capacitor 13 with a voltage present between junction 14 and supply terminal 10. The trigger device 15 is shown as a bilateral switch and is connected between junction 14 and gate 4 of silicon controlled rectifier 1. When the lagging voltage across capacitor 13 reaches a certain level, trigger device 15 becomes conductive and a pulse of current flows between gate 4 and cathode 2. A conductive path then exists between anode 3 and cathode 2 so that a pulse of current flows from terminal 9, through resistor 5, anode 3 and cathode 2 to line terminal 10. Resistor 16 prevents the build up of leakage voltages between gate 4 and cathode 2 which might fire the silicon controlled rectifier 1 prematurely. Diode 17 prevents the possibility of excessive negative voltage from being applied between gate 4 and cathode 2. The P type field effect transistor 18 has the source 19 connected to supply terminal 10 and the drain 20 connected to junction 14 so that without positive voltage applied between gate 21 and source 19 the field effect transistor 18 appears as a low resistance across capacitor 13.

Alternating current voltage at switch contact 6 is rectified by rectifier 22, current limited through resistor 23 and applied to zener diode 24. Resistor 25 is a load resistor across zener diode 24 and also serves to reduce resistance between gate 21 and source 19.

During the previously described charge and discharge cycle of capacitor 13 to trigger the silicon controlled rectifier 1, field effect transistor 18 was acting as if it were not in the circuit because a flat topped positive pulse across zener diode 24 was applied between gate 21 and source 19 to provide a high resistance between drain 20 and source 19. When the gate 4 triggers the silicon controlled rectifier 1, discharge of capacitor 13 ceases, also, during the discharge of capacitor 13 prior to the actual firing of silicon controlled rectifier 1, there is a voltage drop across trigger device 15 so that at the finish of triggering there is still voltage left across capacitor 13. When the voltage between supply terminals 9 and 10 goes through zero crossing the voltage across zener diode 24 becomes zero and the resistance between drain 20 and source 19 drops to the vicinity of 300 ohms and discharges capacitor 13. The low resistance of field effect transistor 18 remains across capacitor 13 during the negative half cycle until the following zero crossing when the charge cycle is repeated. If the field effect transistor 18 were not used, the residual charge left on capacitor 13, after firing of the silicon controlled rectifier 1, would cause the trigger device 15 to trigger too early in the following positive half cycle. Adding more resistance with variable resistance 11 would decrease the voltage across capacitor 13 and prevent triggering so that small output pulses across resistor 5, such as those available with the use of field effect transistor 18 would not be obtained. Also because every charging of capacitor 13 starts at zero voltage, hysteresis is not a factor with changes of variable resistor 11. If the field effect transistor 18 were not in the circuit and capacitor 13 had been charged to almost triggering level when switch 7 was quickly opened and closed, most of the charge on capacitor 13 would remain during the switch 7 off time; if at the moment of switching switch 7 on, the alternating current supply was beginning the positive half cycle, the silicon controlled rectifier 1 would fire too early in the half cycle and too high a pulse would appear across resistor 5. With the field effect transistor in the circuit, capacitor 13 is discharged immediately switch 7 is opened and misfiring of silicon controlled rectifier 1 is avoided.

Figure 2:
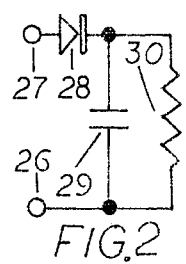
FIG. 2 is a schematic showing a rectifier and filter circuit used in conjunction with the schematic of FIG. 1.

The merits of the invention may be adequately displayed by using the schematic of FIG. 1 in conjunction with the schematic of FIG. 2 to form a direct current power supply. In this case the load resistor 5 of FIG. 1 is made high in value. To form the direct current power supply the components of FIG. 2 are connected to the schematic of FIG. 1 in the following manner. Terminal 26 is connected to anode 3 and terminal 27 is connected to the lead of load resistor 5 which is joined to contact 6 of switch 7. When silicon controlled rectifier 1 fires, a positive pulse flows through rectifier 28 to charge capacitor 29 with resistor 30 forming a load and bleed resistor. Rectifier 28 prevents the direct current voltage across capacitor 29 from being added to the alternating current voltage applied to anode 3 of silicon controlled rectifier 1. If a line operated DC voltmeter and a non line operated DC voltmeter are connected across resistor 30 with the field effect transistor 18 removed from the circuit of FIG. 1 and the alternating current supply voltage at terminals 9 and 10 intermittently interrupted, both voltmeters will show excursions above the previously set value. When the field effect transistor 18 is restored to the circuit of FIG. 1 and the alternating current supply voltage interuptions repeated, the non line operated voltmeter reading will not exceed the previously set value but the line operated voltmeter may show excursions beyond the previously set value. High frequencies generated by local line interuptions will cause many line operated voltmeters to indicate voltage increases across resistor 30 which do not actually occur when the field effect transistor 18 is connected. The false readings may be eliminated by the use of a filter in the alternating current line to the voltmeter.

Figure 3:
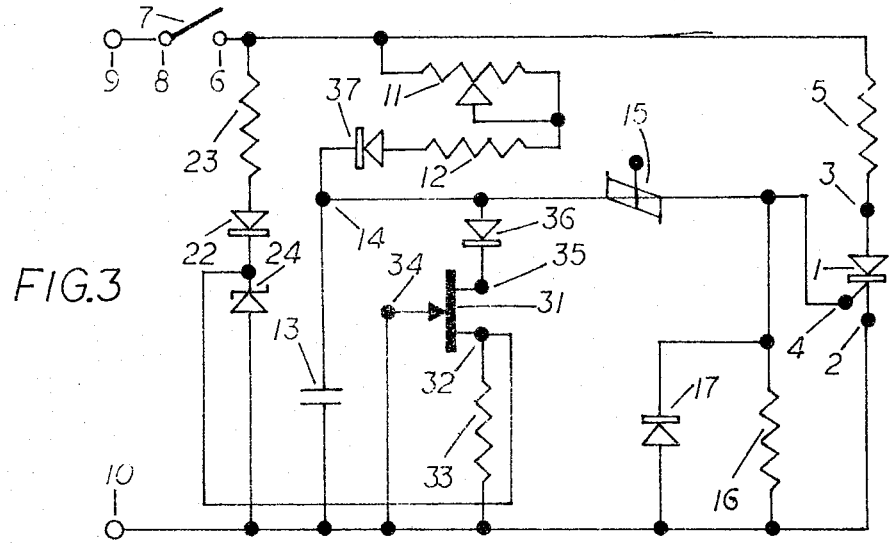
FIG. 3 is a schematic showing an alternate circuit for using an N type field effect transistor in place of the P type of FIG. 1.

FIG. 3 shows the circuitry for using an N type field effect transistor 31 in place of the P type of FIG. 1. The schematic and operation of FIG. 3 is similar to FIG. 1 except for the following differences:

The field effect transistor 31 has a source 32 connected to terminal 10 through resistor 33 with gate 34 also connected to terminal 10. The drain 35 is connected to junction 14 through diode 36 and limiting resistor 12 is connected to junction 14 through diode 37. The positive pulses across zener diode 24 are applied to source 32 to provide high resistance between source 32 and drain 35 during the period when capacitor 13 is being charged. Diode 36 is necessary to prevent the zener diode 24 positive pulse voltage at source 32 and drain 35 from charging capacitor 13. Diode 37 is used so that capacitor 13 is charged only with positive sine wave pulses, if capacitor 13 were charged with a negative voltage, the charge could not be short circuited through field effect transistor 31 because diode 36 would not conduct the negative charge. When the alternating current supply at terminals 9 and 10 is passing through the zero crossing of the sine wave a positive charge on capacitor 13 is short circuited through diode 36, field effect transistor 31 and resistor 33 to prevent misfiring of thyristor 1, to prevent hysteresis when using variable resistor 11 and to provide low amplitude pulse voltages across load resistor 5. Also, if the alternating current voltage at terminals 9 and 10 is interrupted, capacitor 13 is discharged within microseconds after the start of the interuption.

Figure 4:
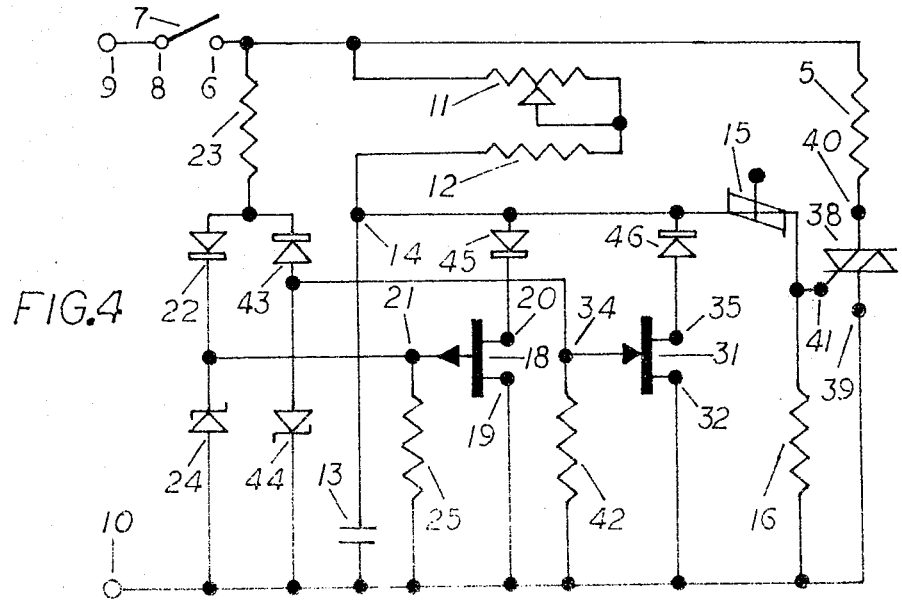
FIG. 4 is a schematic showing a triac using both P and N type field effect transistors to discharge the timing capacitor.

FIG. 4 shows a schematic of the invention using a triac 38 having a main terminal 1 39, main terminal 2 40 and gate 41 to provide both positive and negative pulses across load resistor 5. The operation of components appearing in FIG. 4 but not in FIG. 1 is described as follows:

The N type field effect transistor 31 has a source 32, drain 35 and gate 34 with resistor 42 limiting the resistance between gate 34 and source 32. Rectifier 43 and zener diode 44 supply negative pulses between gate 34 and source 32. When capacitor 13 is being charged with a negative voltage at junction 14, the path between drain 35 and source 32 is of high resistance because of the negative pulse between gate 34 and source 32 so the charge on capacitor 13 is not influenced by field effect transistor 31.

During this negative charging period, field effect transistor 18 has low resistance between drain 20 and source 19 but does not influence the charge on capacitor 13 because diode 45 does not conduct. When capacitor 13 is being charged with a positive voltage at junction 14, the path between drain 20 and source 19 is of high resistance because of the pulse between gate 21 and source 19 so the charge on capacitor 13 is not influenced by field effect transistor 18. During this positive charging period field effect transistor 31 has low resistance but does not influence the charge on capacitor 13 because diode 46 does not conduct. When the alternating current voltage at terminals 9 and 10 is passing through zero voltage crossing or is interrupted, both field effect transistors, 18 and 31, have low resistance and capacitor 13 is discharged through diode 45 or 46.

While particular embodiments of the present invention have been shown and described, it is apparent that various changes and modifications may be made, such as the use of the diac or unijunction transistor in place of the bilateral switch trigger device used in the above description. Also, in some instances the triac could be replaced to good advantage by two silicon controlled rectifiers. Accordingly the above description is illustrative of principles of the present invention and numerous modifications thereof may be devised by those skilled in the art without departing from the spirit and scope of the invention.

What is claimed is:

1. A thyristor control circuit comprising:
   a timing circuit for firing a thyristor consisting of a resistor and a capacitor with the first lead of said resistor connected to the first terminal of a source of sine wave pulses, the second lead of said resistor connected to the first lead of said capacitor to form a junction, the second lead of said capacitor connected to the second terminal of said source of sine wave pulses;
   a trigger device connected between said junction and gate of said thyristor;
   a field effect transistor having a gate, source and drain with said drain effectively connected to said first lead of said capacitor and said source connected to said second lead of said capacitor;
   a means for applying voltage pulses between said gate and said source of said field effect transistor so that the resistance between said drain and said source is high to allow charging of said capacitor through said resistor with the voltage polarity required to trigger said gate of said thyristor and so that the resistance between said drain and said source is low to discharge said capacitor when said sine wave pulses are at and passing through zero amplitude.

* * * * *